(12) United States Patent
Kajiyama

(10) Patent No.: US 7,148,550 B2
(45) Date of Patent: Dec. 12, 2006

(54) SEMICONDUCTOR DEVICE AND SEMICONDUCTOR DEVICE DATA WRITE METHOD HAVING MAGNETO-RESISTANCE EFFECT ELEMENT

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 10/393,278

(22) Filed: Mar. 21, 2003

(65) Prior Publication Data
US 2004/0119065 A1   Jun. 24, 2004

(30) Foreign Application Priority Data
Dec. 24, 2002   (JP) .............................. 2002-372385

(51) Int. Cl.
*H01L 29/82* (2006.01)
(52) U.S. Cl. .............................. 257/421; 257/E29.323; 360/324.2; 365/157; 365/171
(58) Field of Classification Search ................ 365/158, 365/171–173; 360/324.2; 257/252, 421–427
See application file for complete search history.

(56) References Cited

U.S. PATENT DOCUMENTS

| | | | |
|---|---|---|---|
| 5,835,314 A | 11/1998 | Moodera et al. | |
| 6,225,933 B1 * | 5/2001 | Salter et al. | 341/144 |
| 6,587,370 B1 * | 7/2003 | Hirai | 365/158 |
| 6,785,158 B1 * | 8/2004 | Nagashima | 365/157 |
| 6,795,335 B1 * | 9/2004 | Hidaka | 365/158 |
| 6,903,963 B1 * | 6/2005 | Hidaka | 365/158 |

FOREIGN PATENT DOCUMENTS

JP   2002-231904   8/2002

* cited by examiner

*Primary Examiner*—Marcos D. Pizarro
(74) *Attorney, Agent, or Firm*—Oblon, Spivak, McClelland, Maier & Neustadt, P.C.

(57) ABSTRACT

A semiconductor device includes a memory portion in which a plurality of magneto-resistance effect elements each having a hard-axis of magnetization and an easy-axis of magnetization are arranged and one of binary data is written in all the magneto-resistance effect elements, and a circuit portion to which a write current is supplied to write only the other one of the binary data in only a selected magneto-resistance effect element selected from the magneto-resistance effect elements.

4 Claims, 5 Drawing Sheets

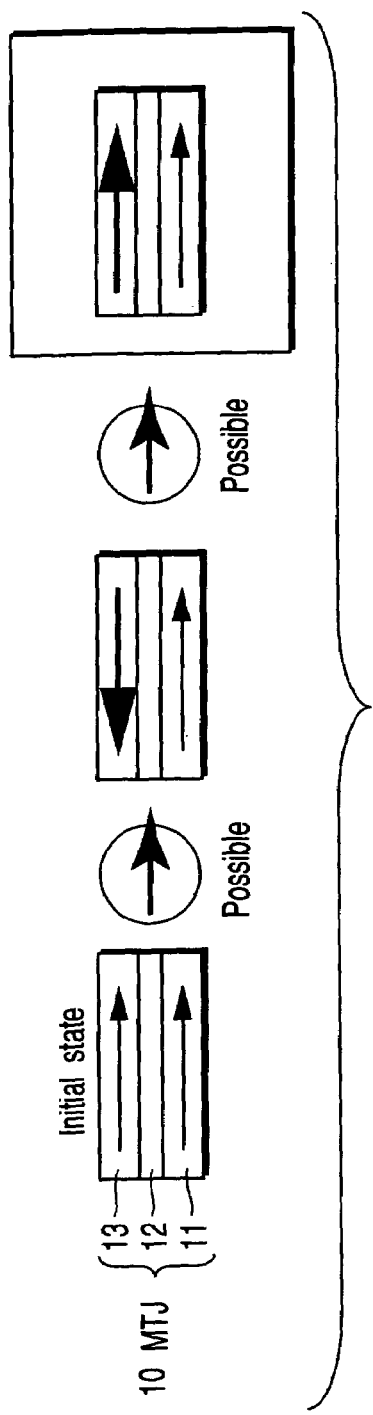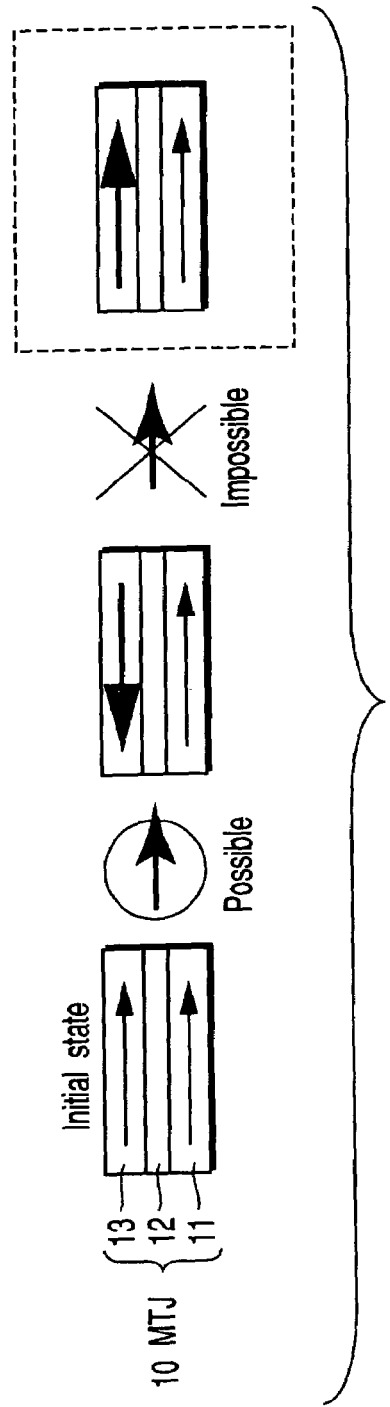
FIG. 5A PRIOR ART
FIG. 5B

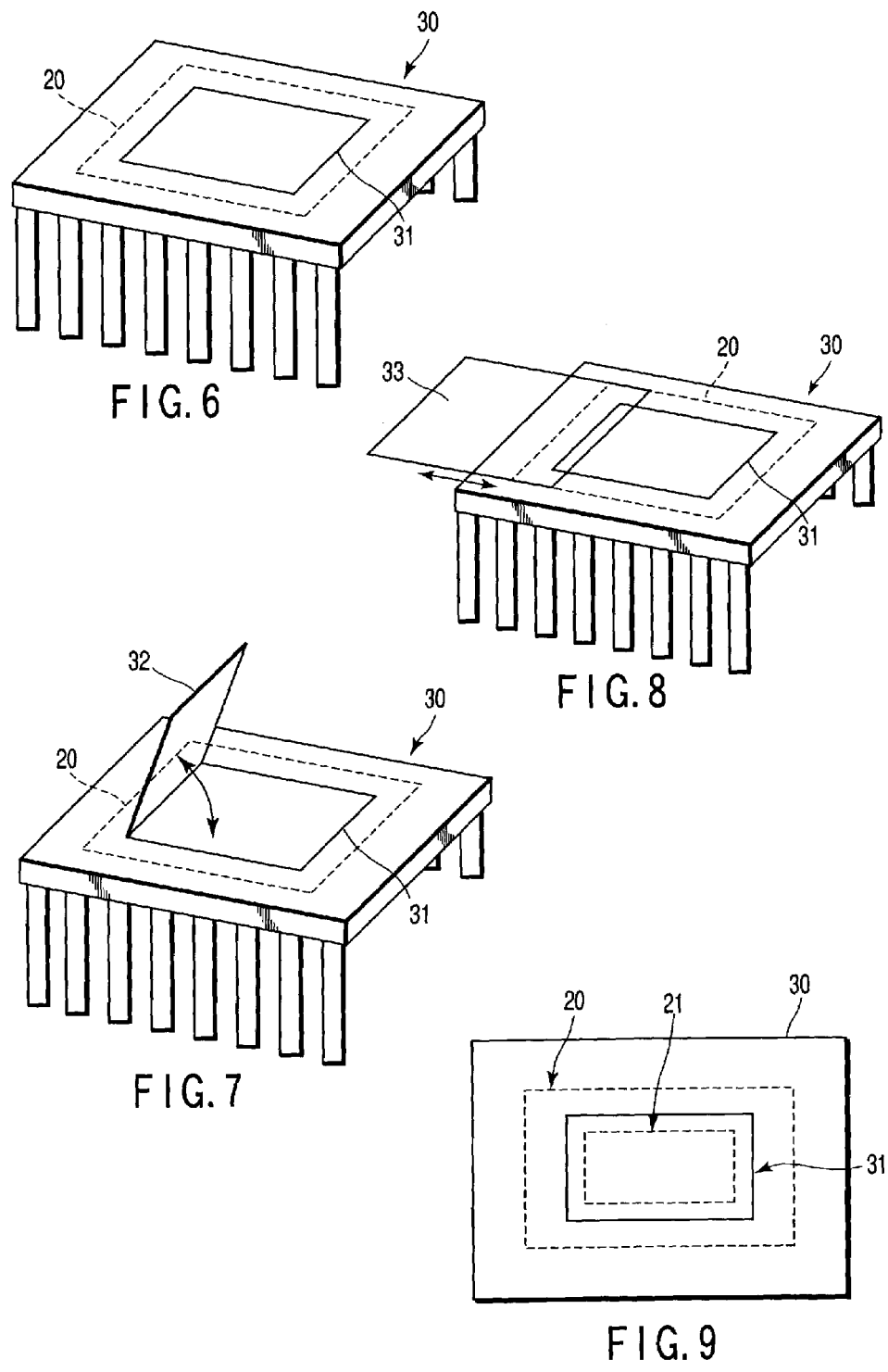

SEMICONDUCTOR DEVICE AND SEMICONDUCTOR DEVICE DATA WRITE METHOD HAVING MAGNETO-RESISTANCE EFFECT ELEMENT

CROSS-REFERENCE TO RELATED APPLICATIONS

This application is based upon and claims the benefit of priority from the prior Japanese Patent Application No. 2002-372385, filed Dec. 24, 2002, the entire contents of which are incorporated herein by reference.

BACKGROUND OF THE INVENTION

1. Field of the Invention

The present invention relates to a semiconductor device and semiconductor device data write method and, more particularly, to an MRAM (Magnetic Random Access Memory) having an MTJ (Magnetic Tunnel Junction) element which stores "1" or "0" information by the TMR (Tunnel Magneto-Resistance) effect.

2. Description of the Related Art

Magnetic random access memories (to be referred to as MRAMs hereinafter) utilizing the TMR (Tunnel Magneto-Resistance) effect are recently considered promising as high-speed, large-capacity storage media.

In such an MRAM, as shown in FIGS. 10 and 11, a first write wiring line (e.g., bit line) WL1 and second write wiring line (e.g., word line) WL2 are arranged to run perpendicularly to each other. An MTJ (Magnetic Tunnel Junction) element 10 is arranged at the intersection of the first and second write wiring lines WL1 and WL2. The MTJ element 10 is formed from a fixed layer 11, a free layer (recording layer) 13, and a tunnel insulating film 12 sandwiched between the fixed layer 11 and the free layer 13.

In the MRAM, in order to write "1" data or "0" data in the MTJ element 10, one end of the first write wiring line WL1 is set to the ground potential, and the other end is set to a ±potential, as shown in FIG. 12. Currents I1 and I3 flow through the first write wiring line WL1 in two directions.

More specifically, as shown in FIG. 10, transistors Tr1a, Tr1b, Tr2a, and Tr2b are arranged as write switching elements at the two ends of the first write wiring line WL1. One end of the current path of each of the transistors Tr1b and Tr2b is connected to the ground terminal.

The first write wiring line WL1 allows the write current I1 to flow by using the transistors Tr1a and Tr1b, and the write current I3 to flow by using the transistors Tr2a and Tr2b. In this manner, the write currents I1 and I3 flow through the first write wiring line WL1 in two directions.

In this conventional MRAM, the current I1 is supplied to the first write wiring line WL1, and the current is supplied to the second write wiring line WL2, writing, e.g., "0" data in the MTJ element 10. After that, the current I3 in a direction opposite to the current I1 is supplied to the first write wiring line WL1, and the current is supplied to the second write wiring line WL2, writing, e.g., "1" data in the MTJ element 10. In other words, data opposite to written data can be rewritten in the MTJ element 10.

However, data rewrite enables rewriting video data and the like, failing to protect copyrights. The MRAM as a new storage medium is required to realize a structure which inhibits rewrite of written data.

BRIEF SUMMARY OF THE INVENTION

A semiconductor device according to a first aspect of the present invention comprises a memory portion in which a plurality of magneto-resistance effect elements each having a hard-axis of magnetization and an easy-axis of magnetization are arranged and one of binary data is written in all the magneto-resistance effect elements, and a circuit portion to which a write current is supplied to write only the other one of the binary data in only a selected magneto-resistance effect element selected from the magneto-resistance effect elements.

According to a second aspect of the present invention, a data write method for a semiconductor device having a memory portion with a plurality of magneto-resistance effect elements, and a peripheral portion which is driven to write only one of binary data in the memory portion, comprises, when writing one of binary data in a selected magneto-resistance effect element selected from the plurality of magneto-resistance effect elements, setting the other one of the binary data in all the magneto-resistance effect elements as an initial state, and writing the one of binary data in the selected magneto-resistance effect element.

BRIEF DESCRIPTION OF THE SEVERAL VIEWS OF THE DRAWING

FIG. 5A is a view showing a data rewritable state in the prior art;

FIG. 5B is a view showing a data non-rewritable state according to the first embodiment of the present invention;

FIG. 6 is a perspective view showing the first module structure according to the second embodiment of the present invention;

FIG. 7 is a perspective view showing the second module structure according to the second embodiment of the present invention;

FIG. 8 is a perspective view showing the third module structure according to the second embodiment of the present invention;

FIG. 9 is a plan view showing the first to third module structures according to the second embodiment of the present invention;

DETAILED DESCRIPTION OF THE INVENTION

Figure 1:
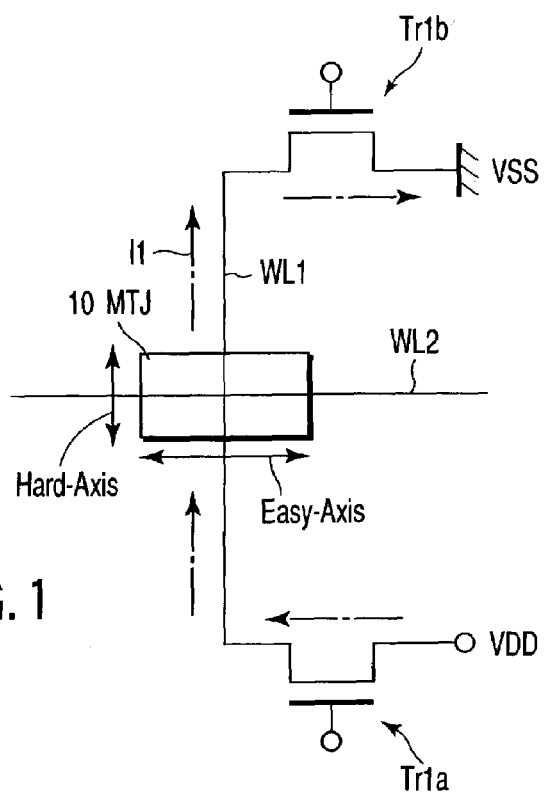
FIG. 1 is a circuit diagram showing an MRAM according to the first embodiment of the present invention.

Preferred embodiments of the present invention are directed to an MRAM (Magnetic Random Access Memory) which stores "1" or "0" information by the TMR (Tunnel Magneto-Resistance) effect. In the following description, an MTJ (Magnetic Tunnel Junction) element is adopted as an element (magneto-resistance effect element) using the magneto-resistance effect.

Preferred embodiments of the present invention will be described below with reference to several views of the accompanying drawing. In the following description, the same reference numerals denote the same parts through the drawing.

[First Embodiment]

In the first embodiment, the arrangement of an MRAM capable of preventing rewrite of written data will be explained.

Figure 2:
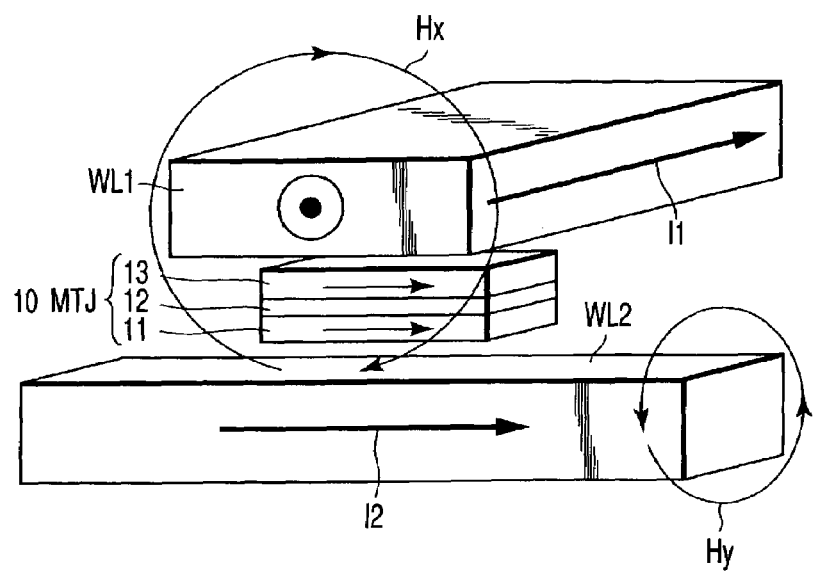
FIG. 2 is a perspective view showing the MRAM according to the first embodiment of the present invention.
Figure 3:
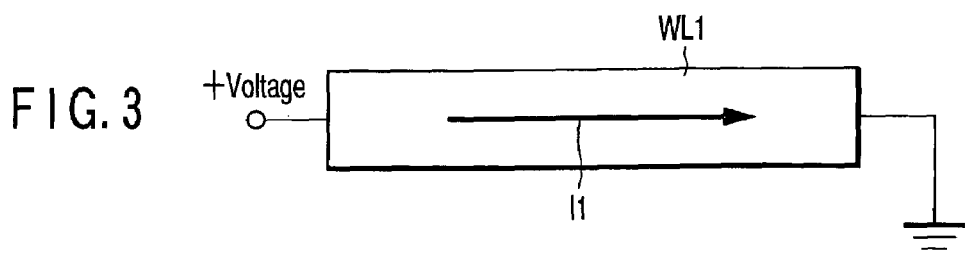
FIG. 3 is a view showing the irreversible current direction of the first write wiring line according to the first embodiment of the present invention.

FIGS. 1 and 2 are a schematic circuit diagram and perspective view showing the MRAM according to the first embodiment of the present invention, respectively. FIG. 3 shows the irreversible current direction of the first write wiring line according to the first embodiment of the present invention.

In the memory portion, as shown in FIGS. 1 and 2, a first write wiring line (e.g., bit line) WL1 and second write wiring line (e.g., word line) WL2 are arranged to run perpendicularly to each other. An MTJ element 10 is arranged at the intersection of the first and second write wiring lines WL1 and WL2. The MTJ element 10 is formed from a fixed layer 11, a free layer (recording layer) 13, and a tunnel insulating film 12 sandwiched between the fixed layer 11 and the free layer 13.

The first write wiring line WL1 runs along the hard-axis of magnetization of the MTJ element 10, and allows a write current I1 to flow in only one direction. That is, as shown in FIG. 3, the first write wiring line WL1 is designed such that one end of the first write wiring line WL1 is set to the ground potential, the other end is set to a given potential (e.g., positive potential), and only one potential enough for sufficient write can be applied.

As a detailed arrangement, write switching elements Tr1a and Tr1b are arranged at the two ends of the first write wiring line WL1. One end (diffusion layer) of the current path of the PMOS transistor Tr1a is connected to a power supply terminal VDD. The other end (diffusion layer) of the current path is connected to one end of the first write wiring line WL1. One end (diffusion layer) of the current path of the NMOS transistor Tr1b is connected to the other end of the first write wiring line WL1. The other end (diffusion layer) of the current path is connected to a ground terminal VSS. The write current I1 flows through the first write wiring line WL1 in only a direction indicated by the arrow in FIG. 1.

The second write wiring line WL2 runs along the easy-axis of magnetization of the MTJ element 10. The second write wiring line WL2 may be set such that the write current flows in only one direction or in two directions.

In this structure, the current I1 flows through the first write wiring line WL1 in only one direction. Only either of "1" and "0" binary data is written in the MTJ element 10.

Data write in this circuit structure will be explained with reference to FIGS. 2 to 4B.

Figure 4A:
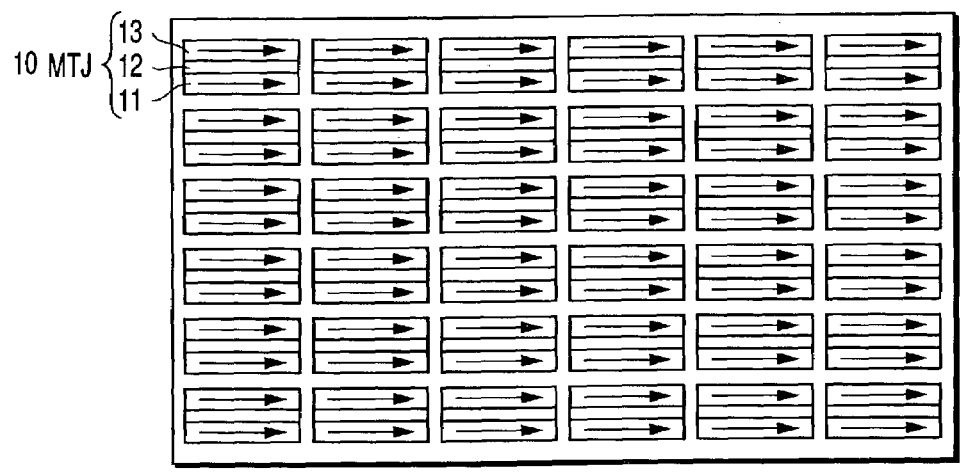
FIG. 4A is a view showing an initial state before write in the MRAM according to the first embodiment of the present invention.

As shown in FIG. 4A, a cell array structure in which pluralities of first and second write wiring lines (not shown) are arranged to run perpendicularly to each other and a plurality of cells formed from MTJ elements 10 are arranged at the intersections of the first and second write wiring lines (not shown) will be exemplified. A plurality of write wiring lines running along the hard-axis of magnetization of the MTJ element 10 are set such that the current flows in only one direction.

To write data (e.g., "0" data) out of binary data as the initial state of the memory, the magnetizations of all the MTJ elements 10 in the memory cells are adjusted to the easy-axis of magnetization (right or left on the sheet surface of FIG. 4A). In this case, the magnetizations of both the fixed layer 11 and free layer 13 in the MTJ element 10 are directed right on the sheet surface. This is defined as the initial state of the memory.

Figure 4B:
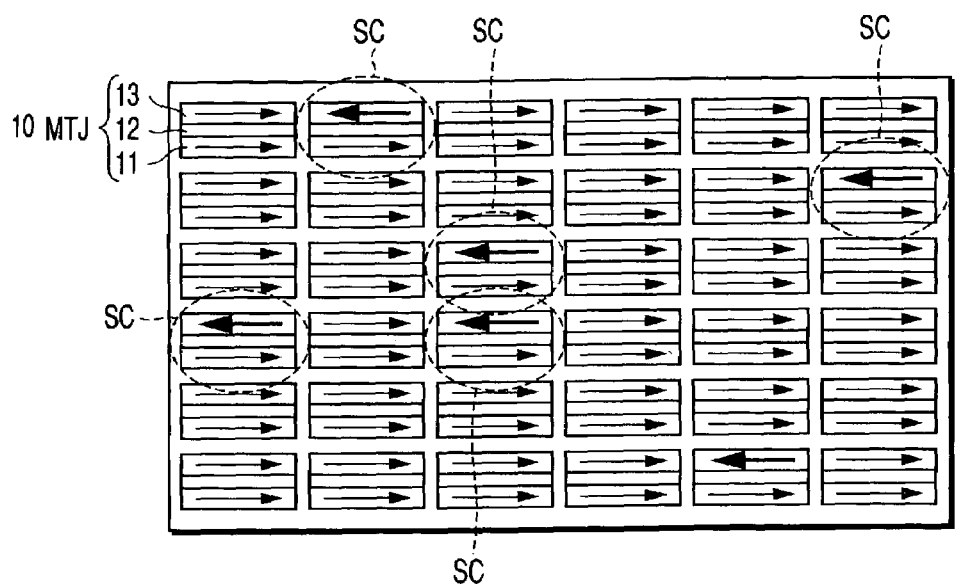
FIG. 4B is a view showing a state after write in the MRAM according to the first embodiment of the present invention.
Figure 10:
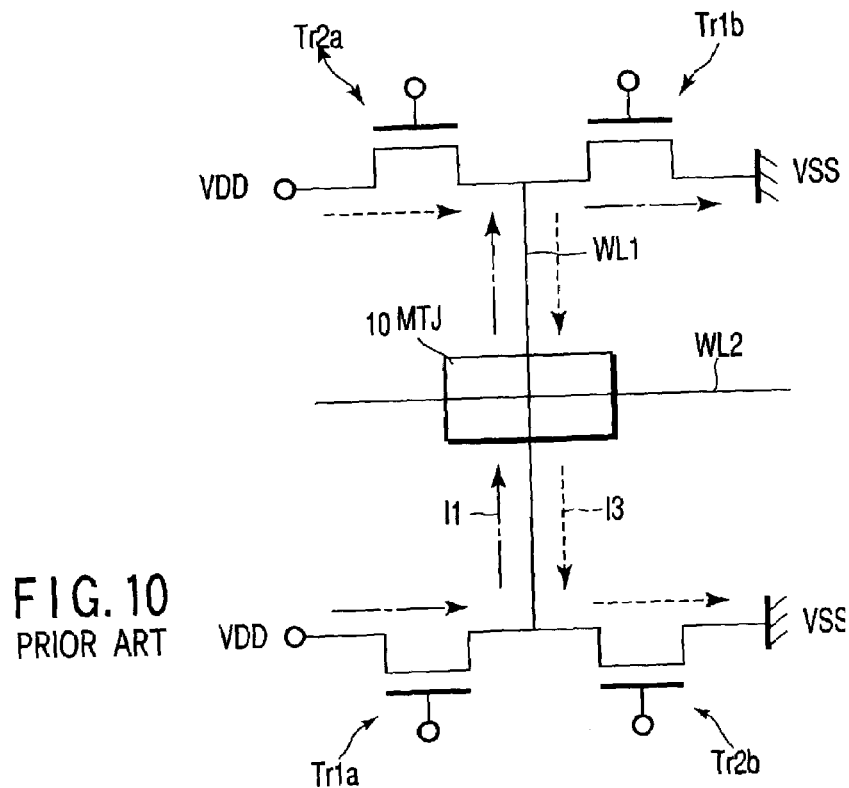
FIG. 10 is a circuit diagram showing a conventional MRAM.
Figure 11:
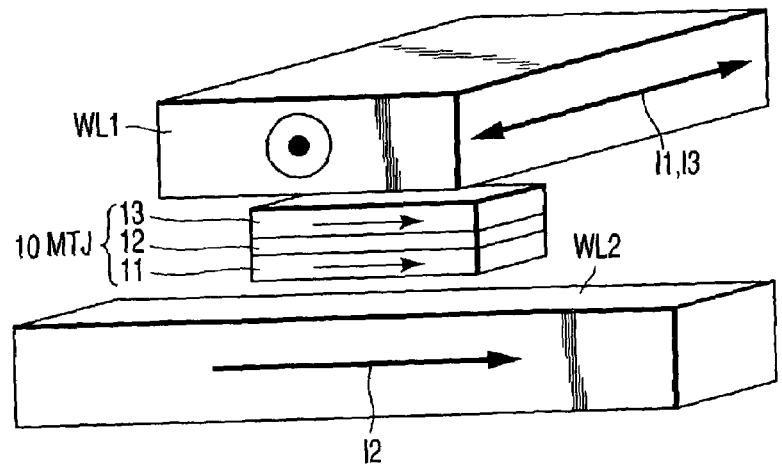
FIG. 11 is a perspective view showing the conventional MRAM.
Figure 12:
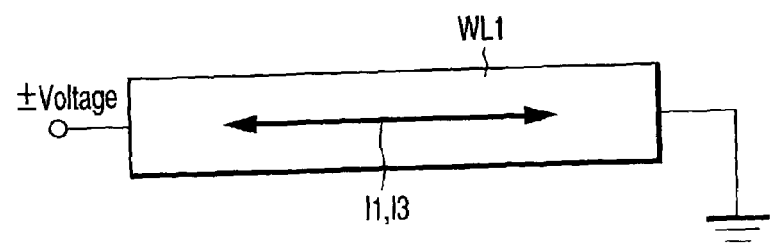
FIG. 12 is a view showing the irreversible current direction of the first write wiring line in the prior art.

In a selected cell SC, as shown in FIG. 2, the write current I1 is supplied to the first write wiring line WL1 to generate a magnetic field Hx parallel to the easy-axis of magnetization. A write current I2 is supplied to the second write wiring line WL2 to generate a magnetic field Hy parallel to the hard-axis of magnetization. The magnetic field Hy directs the magnetization of the MTJ element 10 to the hard-axis of magnetization. The magnetic field Hx directs the magnetization of the MTJ element 10 to the easy-axis of magnetization. As a result, as shown in FIG. 4B, the magnetization of the free layer 13 in only the selected cell SC can be rewritten left on the sheet surface, writing the other data (e.g., "1" data) out of binary data.

Note that the first write wiring line WL1 is set such that the current I1 flows in only one direction. The magnetization of the free layer 13 of the selected cell SC that is directed left on the sheet surface cannot be returned to the original state (state in FIG. 4A).

According to the first embodiment, the first write wiring line WL1 running along the hard-axis of magnetization of the MTJ element 10 is set such that a current flows in only one direction. The present invention and the prior art are different in the following points.

In the prior art, as shown in FIG. 5A, data is written in the MTJ element 10 from the initial state, and then data can be rewritten to return the MTJ element 10 to the initial state. The magnetization of the free layer 13 can be changed twice or more.

To the contrary, in the first embodiment, as shown in FIG. 5B, data is written in the MTJ element 10 from the initial state, but data cannot be rewritten to return the MTJ element 10 to the initial state. The magnetization of the free layer 13 can only be changed once.

That is, the first embodiment enables write in the memory portion only once. Even subsequent write cannot freely change data, destructing data. This embodiment can provide a once-write memory type MRAM, and can prevent rewrite of written data. In a promising MRAM as a high-speed, large-capacity storage medium, the copyright of video data and the like can be protected.

A current flows in only one direction through the first write wiring line WL1 running along the hard-axis of magnetization of the MTJ element 10. This structure can decrease the numbers of transistors Tr1a and Tr1b connected to the first write wiring lines WL1 in comparison with the prior art. The peripheral circuit of the memory cell array can be simplified. This can reduce the area of the peripheral circuit region and the cost.

The MRAM requires a large current for data rewrite. Transistors with a large gate width W capable of supplying a large current are expected to concentrate at the end of the memory cell array. The first embodiment can solve this problem because the current direction of the first write wiring line WL1 is set to one direction to decrease the number of transistors of the peripheral circuit, as described above.

Note that in the first embodiment, the directions of the fixed layer 11 and free layer 13 are the same as the initial magnetization direction of the MTJ element 10. However, the same operation can be achieved even by setting the fixed layer 11 and free layer 13 in different directions.

[Second Embodiment]

An MRAM chip is expected to be packaged, similar to another conventional semiconductor device. The MRAM is assumed to be used as a large-capacity storage element. Erase of a large amount of data for security or the like will require a very long erase time.

From this, the second embodiment provides a packaging structure capable of packaging the MRAM chip of the first embodiment and erasing MRAM data at a high speed.

FIGS. 6 to 8 are perspective views showing the first to third modules in which MRAM chips are packaged. FIG. 9 shows the positional relationship between the package window and the MRAM memory portion in the first to third modules.

As shown in FIG. 6, in the first module structure, an MRAM chip 20 according to the first embodiment is packaged in a package 30. The package 30 has a window 31 which transmits a magnetic wave.

As shown in FIG. 7, in the second module structure, the MRAM chip 20 according to the first embodiment is packaged in the package 30. The package 30 has the window 31 which transmits a magnetic wave. The window 31 has a lid 32 which is opened and closed like a door.

As shown in FIG. 8, in the third module structure, the MRAM chip 20 according to the first embodiment is packaged in the package 30. The package 30 has the window 31 which transmits a magnetic wave. The window 31 has a lid 33 which is slidably opened and closed.

In the first to third module structures, as shown in FIG. 9, the window 31 of the package 30 is formed larger than at least a memory portion 21 of the MRAM chip 20. The window 31 of the package 30 is desirably formed smaller than the surface area of the MRAM chip 20.

The package 30 and the lids 32 and 33 preferably function as a shield against a magnetic wave in order to ensure data reliability. Hence, the package 30 and the lids 32 and 33 are made of a magnetic shield material, e.g., a magnetic metal alloy.

Note that the shape of the window 31 of the package 30 and the shapes of the lids 32 and 33 are not limited to the illustrated shapes, and can be variously changed.

The second embodiment provides the following effects.

The first module structure allows applying a magnetic field to the memory portion 21 of the MRAM chip 20 via the window 31 of the package 30. Data of the MRAM chip 20 can be erased at once. Even a large amount of data can be erased at a high speed.

In addition to the effect of the first module structure, the second module structure can adjust the magnetic influence by attaching the lid 32 to the window 31. That is, the lid 32 and package 30 shield a magnetic wave except during reproduction in order to maintain data. The magnetic shield is set in a normal state except during batch erase, and data can be erased via the window 31 in batch erase.

The third module structure can obtain the effects of the first and second module structures. Since the lid 33 is opened and closed in the lateral direction, restrictions on the upper region of the module are reduced, compared to the second module structure.

In this fashion, the first to third module structures realize batch erase of data and can shorten the data erase time.

Once data is written in the MRAM chip 20 according to the first embodiment, data cannot be rewritten. Even if the MRAM chip 20 is required to reproduce, e.g., the initial state, the initial state can be reproduced by applying a magnetic field via the window 31 of the package 30. The MRAM chip 20 according to the first embodiment is packaged into the package 30 with a window, obtaining a reproducible once-write memory.

Reproduction work can be performed by a manufacturer or the like by managing the magnetic force in actual reproduction. A reproduction device can be sold as a product or a product accessory.

In the second embodiment, the type of package which contains the MRAM chip 20 is not limited, and can be applied to, e.g., a card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of magneto-resistance effect elements each having a hard-axis of magnetization and an easy-axis of magnetization, one of binary data being written in all the magneto-resistance effect elements;
   a first write wiring line which runs along the hard-axis of magnetization of a selected magneto-resistance effect element selected from the magneto-resistance effect elements, and has one end connected to a power supply terminal and the other end connected to only a ground terminal, and through which a first write current flows, the first write current flowing only along one direction of the hard-axis of magnetization to write only the other one of the binary; and
   a second write wiring line which runs along the easy-axis of magnetization of the selected magneto-resistance effect element and through which a second write current flows, the second write current flowing only along one direction of the easy-axis of magnetization.

2. The device according to claim 1, further comprising:
   a first circuit having one end connected to the one end of the first write wiring line and the other end connected to the power supply terminal, and
   a second circuit having one end connected to the other end of the first write wiring line and the other end connected to the ground terminal.

3. The device according to claim 2, wherein the first and second circuits include transistors.

4. The device according to claim 2, wherein the first circuit includes a PMOS transistor and the second circuit includes an NMOS transistor.

* * * * *